United States Patent [19]

Chang et al.

[11] Patent Number: 4,476,435

[45] Date of Patent: Oct. 9, 1984

[54] DIGITAL DEMODULATION OF FREQUENCY MODULATED SIGNALS

[75] Inventors: Hyokang Chang, New Haven; Kishan Shenoi, Fairfield; Bgahwati P. Agrawal, Shelton, all of Conn.

[73] Assignee: International Telephone and Telegraph Corporation, New York, N.Y.

[21] Appl. No.: 360,735

[22] Filed: Mar. 22, 1982

[51] Int. Cl.$^3$ .......................... H03D 3/00; H03K 9/08
[52] U.S. Cl. ..................................... 329/50; 329/106; 329/126; 329/145; 332/1; 375/94; 455/214
[58] Field of Search ................. 329/50, 106, 126, 145; 375/22, 94; 455/214, 337; 332/1

[56] References Cited

U.S. PATENT DOCUMENTS 3,528,019 9/1970 Inoue .................................... 329/106
4,054,840 10/1977 Sato .................................. 329/145 X

*Primary Examiner*—Eugene R. Laroche
*Assistant Examiner*—Robert Pascat
*Attorney, Agent, or Firm*—John T. O'Halloran; Jeffrey P. Morris; Alfred C. Hill

[57] ABSTRACT

The digital demodulation of frequency modulated signals produces a pulse duration modulated signal proportional to the analog modulation signal component of the FM input signal from the FM input signal and a delayed version thereof and the pulse duration modulated signal is then converted to a digital signal representative of the analog modulation signal component of the FM signal by a delta sigma modulator and a decimator which also provides equalization of the FM signal to remove pre-emphasis applied to the FM signal prior to its transmission.

34 Claims, 6 Drawing Figures

DIGITAL DEMODULATION OF FREQUENCY MODULATED SIGNALS

BACKGROUND OF THE INVENTION

The present invention relates to frequency modulation (FM) demodulators and more particularly to a simplified circuit technique implementable in integrated circuit structure for converting an analog FM signal to a digital representation of the analog modulation signal component of the FM signal.

The invention is particularly useful in telecommunications, television, radio satellite communication applications and, in general, in any FM receiver utilizing digital signal processing technology.

FIG. 1 is an FM demodulator arrangement for converting an analog FM signal to a digital signal representative the analog modulation signal component of the FM signal known in the prior art. An analog FM input signal from the IF stages of an FM receiver is demodulated by an analog FM demodulator 1 whose output is de-emphasized in the equalizer 2 to remove the pre-emphasis effect provided in the transmission of the FM signal to enhance the signal-to-noise ratio thereof. Finally, the demodulated and equalized analog signal is converted to a digital signal at the analog-to-digital converter 3. The technique of the prior art as shown in FIG. 1 requires many analog components because each of the circuits 1, 2 and 3 provide a function separately and independently one from the other.

SUMMARY OF THE INVENTION

An object of the present invention is to provide digital demodulation of analog FM signals which is simpler than that of the prior art, particularly since one circuit can provide two functions of the prior art, namely equalization and a digital output.

Another object of the present invention is to provide a digital demodulation technique for frequency modulated signals which maximizes the use of integrated circuits and reduces the number of analog components.

A feature of the present invention is the provision of a digital frequency modulation (FM) demodulator to convert an analog FM signal having a carrier signal component and an analog modulation signal component to a digital representation of the analog modulation signal component comprising first means responsive to the FM signal and a delayed version thereof to produce a pulse duration modulated (PDM) signal proportional to the modulation signal component; and second means coupled to the first means responsive to the PDM signal to produce a digital signal representative of the modulation signal component.

Another feature of the present invention is the provision of a method of converting an analog frequency modulated (FM) signal having a carrier signal component and an analog modulation signal component to a digital representation of the analog modulation signal component comprising the steps of converting the FM signal to a pulse duration modulation (PDM) signal proportional to the modulation signal component; and converting the PDM signal to a digital signal representative of the modulation signal component.

BRIEF DESCRIPTION OF THE DRAWING

Above-mentioned and other features and objects of this invention will become apparent by reference to the following description taken in conjunction with the accompanying drawing, in which.

DESCRIPTION OF THE PREFERRED EMBODIMENT

Figure 1:
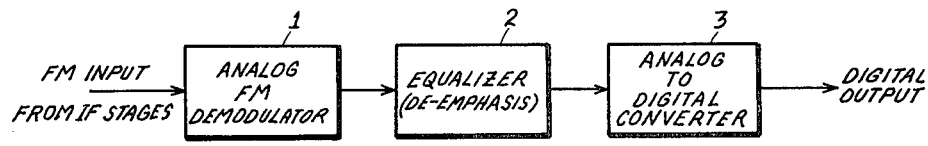
FIG. 1 is a block diagram of a prior art digital demodulation technique for frequency modulation signals described hereinabove under the heading "Background of the Invention"
Figure 2:
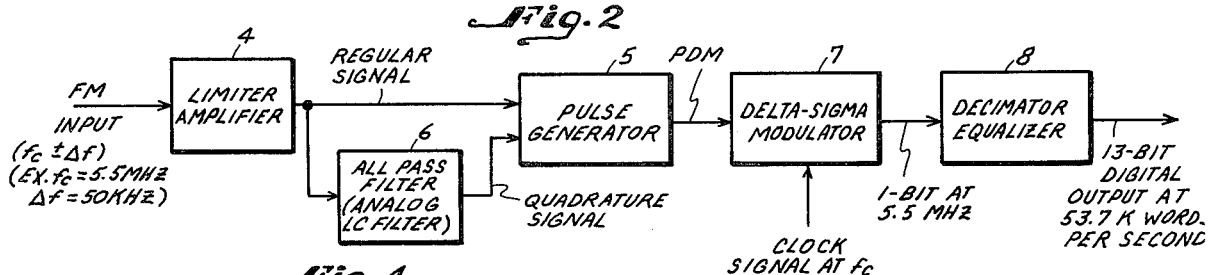
FIG. 2 is a block diagram of the digital demodulator in accordance with the principles of the present invention.

Referring to FIG. 2 there is illustrated therein a simplified block diagram of the digital FM demodulator of the present invention.

The analog FM input signal from the intermediate frequency amplifier of, for example, a television receiver, is applied to a limiter/amplifier stage 4 to remove spurious amplitude variations in the FM signal. By way of example, the FM input signal is chosen to have a center or carrier frequency $f_c = 5.5$ MHz (megahertz) with a frequency deviation of $\pm \Delta f = 50$ KHz (kilohertz) proportional to an analog modulation signal.

The output of limiter/amplifier 4 is split and applied to pulse generator 5 to convert the FM signal into a PDM signal which is proportional to the analog modulation signal of the FM signal. Pulse generator 5 operates on two inputs, the regular signal (the FM signal) and a quadrature signal (a delayed version of the FM signal) provided in the all pass filter 6 coupled to the output of limiter/amplifier stage 4. Pulse generator 5 produces a pulse output, or is high, when the regular signal input is negative and quadrature signal input is positive. All pass filter 6, which is an LC filter, produces the quadrature signal and can be viewed as a frequency sensitive delay element. For the FM signal without frequency deviation, the quadrature signal lags in phase by 90° with respect to the original FM signal. With frequency deviation, however, the phase lag of the quadrature signal varies in proportion to the corresponding frequency deviation or analog modulation signal.

Figure 4:
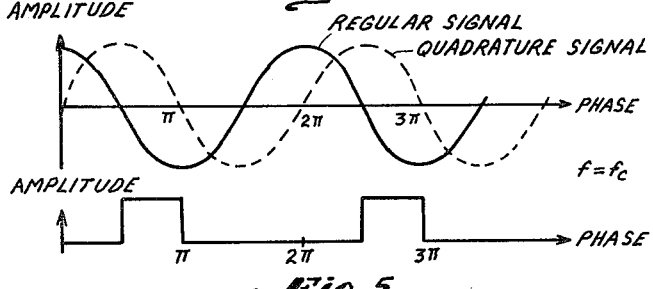
FIGS. 4-6 are curves useful in illustrating the conversion of the FM input signal to a pulse duration modulation (PDM) signal in the pulse generator of FIG. 2 under various conditions of the input signal frequency.
Figure 3:
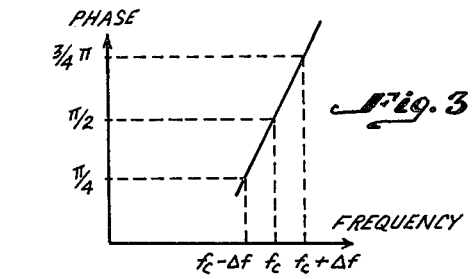
FIG. 3 is a phase vs. frequency characteristic of the all pass filter of FIG. 2.
Figure 5:
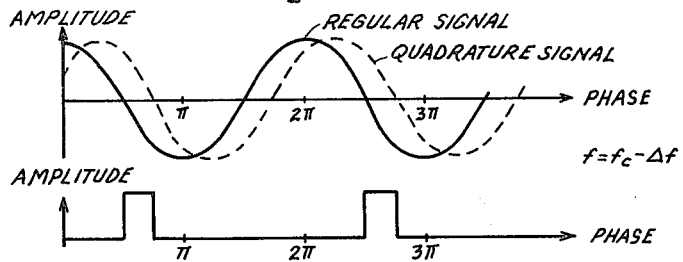
Figure 6:
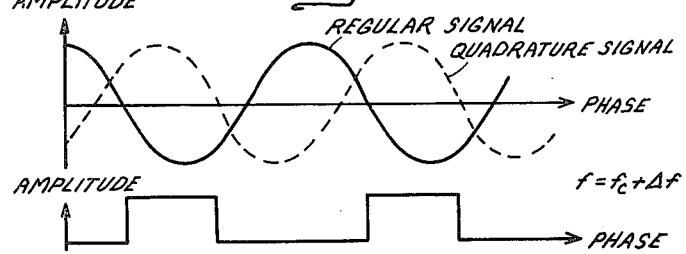

The response of the all pass filter 6 is illustrated in FIG. 3 and the process of converting the FM signal into a PDM signal is illustrated in FIGS. 4, 5 and 6 for the condition where f is equal to $f_c$, f is equal to $f_c - \Delta f$ and f equals $f_c + \Delta f$. It should be noted from FIGS. 4-6 that the width of the PDM signal pulse is determined by the instant the regular signal crosses the zero axis in the negative direction and also the time at which the quadrature signal crosses the zero axis in a negative direction. Thus, the circuit implementation of pulse generator 5 could be a logic circuit which responds to the regular signal crossing the zero axis in a negative direction to start the production of an output or, in other words, render the output operative, and then responds to the quadrature signal crossing the zero axis in a negative direction to render the output of the logic circuit inoperative, thereby generating a pulse of the PDM signal. Another circuit that could implement the pulse generator 5 is a logic circuit that responds to the simultaneous occurrence of negative regular signal and positive quadrature signal so as to produce the resultant pulse output as illustrated in FIG. 4-6.

Due to the action of pulse generator 5, which is determined by the zero-crossing instants and the instantaneous frequency of the input signal, the output is not sensitive to amplitude variations of the input signal.

If an analog output were desired, which would be the analog modulation signal, the output of pulse generator 5 could be passed through a low-pass filter to obtain the analog output. However, since a digital output is required, an analog-to-digital conversion process is provided after pulse generator 5. As illustrated in FIG. 2, this analog-to-digital conversion is accomplished in the delta sigma modulator 7 clocked by a clock signal having a frequency equal to the center or carrier frequency $f_c$ of the FM input signal and a decimator-equalizer stage 8. The modulator 7 clocked at $f_c$ acts to convert the PDM signal into one digital bit indicating the direction of change of amplitude. This one bit output is then applied to the decimator-equalizer stage 8 which produces a thirteen bit digital signal at a rate less than the rate of the input signal thereof which in the example employed herein is at a rate of 53.7 kilowords per second. This is the digital output of the demodulator of the present application.

The decimator portion of stage 8 is a low-pass filter structure whose circuit and operation is that disclosed in U.S. Pat. No. 4,302,631, whose disclosure is incorporated herein by reference. By adjusting the characteristic of the decimator, the preemphasis, imparted to the FM signal prior to transmission to enhance the signal-to-noise ratio can be removed in the stage 8 by an equalizer so that the digital output signal is free of distortions.

The novel circuit structure illustrated in FIG. 2 enables the digital FM demodulator of the present invention to be entirely built as an integrated circuit at less cost and with simpler manufacturing than the prior art arrangement. It should also be noted that in the arrangement of the present invention as illustrated in FIG. 2, equalization of the FM signal is accomplished in a stage also performing another function which also produces a reduction in the number of components required to manufacture the demodulator of the present invention.

The circuit structure of FIG. 2 can be employed in and FM receiver employing digital signal processing techniques.

While we have described above the principles of our invention in connection with specific apparatus, it is to be clearly understood that this description is made only by way of example and not as a limitation to the scope of our invention as set forth in the objects thereof and in the accompanying claims.

We claim:

1. A digital frequency modulation (FM) demodulator to convert an analog FM signal having a carrier signal component and an analog modulation signal component to a digital representation of said modulation signal component comprising:
   first means responsive to said FM singal and a delayed version thereof to produce a pulse duration modulated (PDM) signal proportional to said modulation signal component; and
   second means coupled to said first means responsive to said PDM signal to produce a digital signal representative of said modulation signal component.

2. A demodulator according to claim 1, wherein said first means includes
   a pulse generator responsive to said FM signal being negative and said delayed version of said FM signal being positive simultaneously to produce said PDM signal.

3. A demodulator according to claim 2, wherein said first means further includes
   a frequency sensitive delay element coupled to said pulse generator responsive to said FM signal to produce said delayed version of said FM signal.

4. A demodulator according to claim 3, wherein said delay element is an all pass filter.

5. A demodulator according to claim 4, wherein said all pass filter is an LC filter.

6. A demodulator according to claim 3, wherein said first means further includes
   a limiter/amplifier coupled to said pulse generator and said delay element to remove spurious amplitude variations from said FM signal.

7. A demodulator according to claims 1, 2, 3 or 6, wherein
   said second means includes
   an analog-to-digital converter coupled to said first means to provide a digital output having a predetermined rate, and
   a decimator coupled to said converter to provide said digital signal having a rate less than said predetermined rate.

8. A demodulator according to claim 7, wherein said converter is a delta sigma modulator clocked at said predetermined rate.

9. A demodulator according to claim 8, wherein said predetermined rate is equal to said carrier signal component.

10. A demodulator according to claim 9, wherein said FM signal was pre-emphasized prior to transmission thereof, and
said decimator has a characteristic to remove said pre-emphasis.

11. A demodulator according to claim 7, wherein said predetermined rate is equal to said carrier signal component.

12. A demodulator according to claim 11, wherein said FM signal was pre-emphasized prior to transmission thereof, and
said decimator has a characteristic to remove said pre-emphasis.

13. A demodulator according to claim 7, wherein said FM signal was pre-emphasized prior to transmission thereof, and
said decimator has a characteristic to remove said pre-emphasis.

14. A demodulator according to claim 1, wherein said first means includes
   a pulse generator responsive to said FM signal crossing a reference voltage in a negative direction to render said pulse generator operative and responsive to said delayed version of said FM signal crossing said reference voltage in said negative direction to render said generator inoperative thereby producing said PDM signal.

15. A demodulator according to claim 14, wherein said first means further includes
   a frequency sensitive delay element coupled to said pulse generator responsive to said FM signal to produce said delayed version of said FM signal.

16. A demodulator according to claim 15, wherein said delay element is an all pass filter.

17. A demodulator according to claim 16, wherein said all pass filter is an LC filter.

18. A demodulator according to claim 17, wherein said first means further includes
a limiter/amplifier coupled to said pulse generator and said delay element to remove spurious amplitude variations from said FM signal.

19. A demodulator according to claims 14, 15 or 18, wherein
said second means includes
an analog-to-digital converter coupled to said first means to provide a digital output having a predetermined rate, and
a decimator coupled to said converter to provide said digital signal having a rate less than said predetermined rate.

20. A demodulator according to claim 19, wherein said converter is a delta sigma modulator clocked at said predetermined rate.

21. A demodulator according to claim 20, wherein said predetermined rate is equal to said carrier signal component.

22. A demodulator according to claim 21, wherein
said FM signal was pre-emphasized prior to transmission thereof, and
said decimator has a characteristic to remove said pre-emphasis.

23. A demodulator according to claim 19, wherein said predetermined rate is equal to said carrier signal component.

24. A demodulator according to claim 23, wherein
said FM signal was pre-emphasized prior to transmission thereof, and
said decimator has a characteristic to remove said pre-emphasis.

25. A demodulator according to claim 19, wherein
said FM signal was pre-emphasized prior to transmission thereof, and
said decimator has a characteristic to remove said pre-emphasis.

26. A method of converting an analog frequency modulated (FM) signal having a carrier signal component and an analog modulation signal component to a digital representation of said modulation signal component comprising the steps of:
converting said FM signal to a pulse duration modulated (PDM) signal proportional to said modulation signal component; and
converting said PDM signal to a digital signal representative of said modulation signal component.

27. A method according to claim 26, wherein
said step of converting said FM signal includes the step of
responding to said FM signal and a delayed version thereof to produce said PDM signal.

28. A method according to claim 27, wherein
said step of converting said FM signal further includes the step of
delaying said FM signal in a frequency sensitive device to provide said delayed version of said FM signal.

29. A method according to claim 28, wherein
said step of converting said FM signal further includes the step of
removing spurious amplitude variations from said FM signal prior to said step of responding.

30. A method according to claim 27, wherein
said step of converting said FM signal further includes the step of
removing spurious amplitude variations from said FM signal prior to said step of responding.

31. A method according to claims 26, 27, 28 29 or 30, wherein
said step of converting said PDM signal includes the step of
responding to said PDM signal to provide a digital output having a predetermined rate, and
decimating said digital output to provide said digital signal having a rate less than said predetermined rate.

32. A method according to claim 31, wherein
said digital output includes one delta sigma modulation bit, and
said predetermined rate is equal to said carrier signal component.

33. A method according to claim 32, wherein
said FM signal was pre-emphasized prior to transmission thereof, and
said step of decimating includes the step of removing said pre-emphasis.

34. A method according to claim 31, wherein
said FM signal was pre-emphasized prior to transmission thereof, and
said step of decimating includes the step of removing said pre-emphasis.

* * * * *